US007489137B2

(12) United States Patent
Williams

(10) Patent No.: US 7,489,137 B2
(45) Date of Patent: Feb. 10, 2009

(54) POWER LINE INDUCTION OF SHEATH TEST CURRENT TO DISCOVER DEFECTIVE COAXIAL CABLE

(76) Inventor: Thomas Holtzman Williams, 6423 Fairways Dr., Longmont, CO (US) 80503

( * ) Notice: Subject to any disclaimer, the term of this patent is extended or adjusted under 35 U.S.C. 154(b) by 735 days.

(21) Appl. No.: 11/104,941

(22) Filed: Apr. 13, 2005

(65) Prior Publication Data

US 2005/0226164 A1 Oct. 13, 2005

Related U.S. Application Data

(60) Provisional application No. 60/561,592, filed on Apr. 13, 2004.

(51) Int. Cl.
 *G01R 31/08* (2006.01)
 *G01R 31/02* (2006.01)
 *H04N 7/173* (2006.01)
(52) U.S. Cl. .................. 324/527; 324/539; 725/107
(58) Field of Classification Search ................. 324/527, 324/539; 725/107, 125
 See application file for complete search history.

(56) References Cited

U.S. PATENT DOCUMENTS 5,990,687 A 11/1999 Williams

OTHER PUBLICATIONS

Correlating Return—Band Impulsive Noise Measurements From Houses with Sheath Current Induction Test Results. 1999 NCTA Technical Papers, by Thomas H. Williams.

*Primary Examiner*—Timothy J Dole

(57) ABSTRACT

A method to discover defective coaxial shielding in cable lines in a building by inducing a test current into the nearby alternating current (AC) power lines (also known as "mains" in the United Kingdom) and measuring a resulting induced test signal inside the coaxial cable lines. A test signal current driven onto the power lines from a wall socket will propagate back to the main electrical box in the building. The main electrical box is normally connected to a ground, such as water pipes or a ground rod driven into the earth. Some of the test signal will be transferred to the outside of the coaxial cable in the building by radiation, conduction or induction. If the coaxial cable has perfect shield integrity, none of the test signal will be induced into the center conductor of the coaxial cable. However, if the coaxial cable has poor shielding integrity or a shield break, some portion of the test current will be transferred into the inside of the cable, potentially causing interference with cable signals. A broadband test signal can be intentionally driven onto the building's power lines and measured at a convenient location in the building's coaxial cable, such as at the tap, the ground block, or inside the house. Optionally, the test signal can propagate back to the headend where it can be observed and measured. A display from the headend, such as spectrogram showing the test signal's interference, can be relayed back to the field where the test result can be viewed by a technician. Methods are disclosed to reduce interference of the test signal with upstream data signals.

8 Claims, 4 Drawing Sheets

POWER LINE INDUCTION OF SHEATH TEST CURRENT TO DISCOVER DEFECTIVE COAXIAL CABLE

This patent application is a continuation of provisional patent application 60/561,592 filed on Apr. 13, 2004 and titled Power Line Induction of Sheath Test Current to Discover Defective Coaxial Cable. This invention relates to systems for testing coaxial cable networks. More particularly, it relates to systems for testing the shielding effectiveness of coaxial cable plant so that defects may be identified and repaired.

BACKGROUND—FIELD OF THE INVENTION

Description of Prior Art

Hybrid fiber-coax cable systems are widely used in the United States and other countries to distribute television programming and to provide two-way services such as telephony and cable modem access to the World Wide Web. The architecture conventionally used in the US is called hybrid fiber-coax. Fiber optic cable connects a central location, called a hub or a headend, to a remote location, called a node. Henceforward, the terms 'hub' and 'headend' will be used interchangeably, and the terms 'building' and 'house' may be interchanged. Signals traveling toward the house are said to be traveling in the downstream direction and signals traveling toward the headend are said to be traveling in the upstream direction. In the United States, signals in the downstream direction may be in the 54-860 MHz frequency band, and signals in the upstream direction may be in the 5-42 MHz frequency band. Inside a node, the downstream fiber optic signal is converted from a light wave signal to an electrical signal and distributed to houses or businesses over coaxial cable using a tree-and-branch architecture. Inside the house are terminal devices, which may be television sets, cable modems, cable telephone adapters, set top boxes or other devices. Signals are sent from the house back to the node via coaxial cable, and from the node to the headend via fiber optic cable.

Because of the tree-and-branch architecture, any noise or undesired signals in the upstream frequency band from any connected house in the node will add in a summation process called "noise funneling". The noise can cause an interference with upstream services in a manner well known in the art. Because of the tree-and-branch architecture any noise in the upstream direction from any house in the node can affect services, such as telephone service, to all houses in the node. One common way that noise from electrical sources in the house enters the coaxial cable plant is from coaxial cable with damaged shielding. The coaxial shielding may be damaged from animal chews, craft error, corrosion or mechanical damage. Connectors in the coaxial cable are a particular weak point.

Thus, there is a need to find damaged coaxial cable inside houses. One prior art method is to measure signal leakage in the downstream frequency band that is originating from a shield break. This method has a number of disadvantages, including the fact that the test is performed in the downstream frequency band, while a noise problem is in the upstream frequency band. Another prior art method is to use sheath current induction as described in U.S. Pat. No. 5,990,687 "Measuring Shield Breaks in Coaxial Cable by a Sheath Test Current". This method uses a transformer with a magnetic core, a primary winding connected to a broadband reference test signal, and a secondary winding, which is the shield of a coaxial cable. Another method is to radiate the house with a signal from a powerful transmitter operating in the return frequency band. The coaxial cable is measured for a resulting test signal on its center conductor.

An article was published in the 1999 NCTA Technical Papers titled "Correlating Return-Band Impulsive Noise Measurements from Houses with Sheath Current Induction Test Results" by Thomas H. Williams. This article disclosed a method to create electrical noise on the AC power lines and then observe resulting cross coupling onto the coaxial cable's center conductor when a shield break was created. The electrical noise was generated by an electromechanical relay that was rapidly switching an inductive load on and off, so the contacts were frequently arcing. This method produced an unrepeatable, high-energy test signal.

Currently, power companies are testing Internet access devices that use power line radio frequency (RF) current to provide high-speed data. These devices may produce additional interference with upstream cable transmissions if coaxial cable in the building has shield breaks. Thus, if cable operators are going to provide reliable two-way services they have a need to find and fix cable shield breaks in buildings.

SUMMARY OF THE INVENTION

This application discloses test system for finding a break in a shield of a coaxial cable, the test system comprising:

A broadband signal generator having an output that supplies a test signal;

A coupling device for coupling the test signal to AC power lines in a building;

An electrical coupling between the AC power lines and a coaxial cable in the building;

A receiver connected to a center conductor of the coaxial cable, for receiving an induced test signal from a shield to the center conductor, and for indicating when the magnitude of the induced test signal received exceeds the magnitude of the induced test signal received from an unbroken coaxial cable, thereby indicating a shield break is present in the coaxial cable.

LIST OF FIGURES

DESCRIPTION FIG. 1

Figure 1:
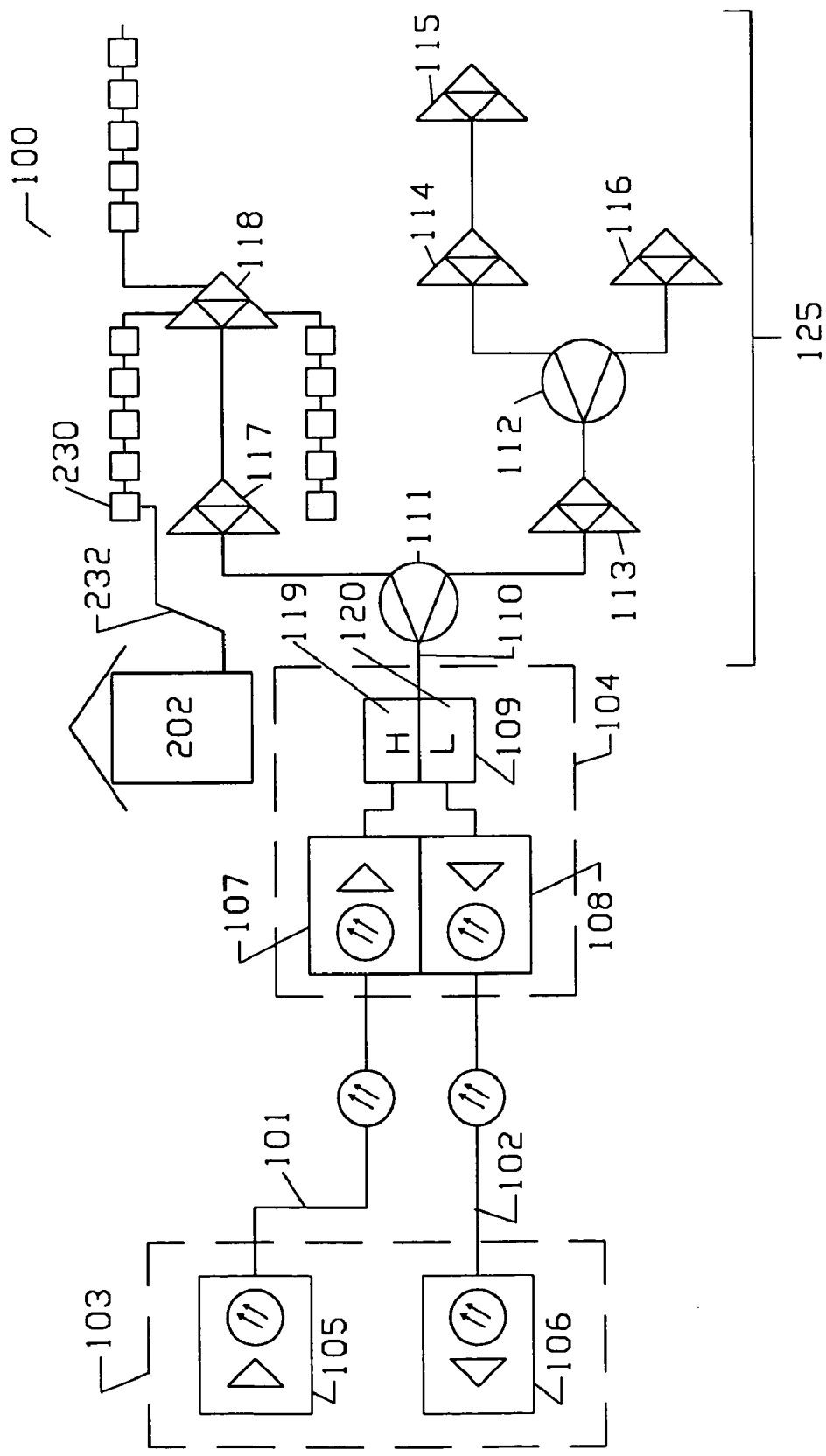
FIG. 1 is block diagram of a hybrid fiber coax cable system

FIG. 1 is a prior-art block diagram that illustrates a bi-directional cable system 100 which employs a single mode fiber optic cable 101 for the long reach from a headend 103 to a fiber node 104. In the headend 103, which is the collection point for downstream signals, are located a downstream laser transmitter 105 and an upstream laser receiver 106. At the fiber node 104, which is typically housed in a weather tight outdoor housing, a downstream signal is converted from an optical signal into an electrical signal by a downstream laser receiver 107 and an upstream electrical signal is converted into an optical signal by an upstream laser transmitter 108. The upstream and downstream electrical signals are applied to a diplex filter 109, which allows bidirectional signal flow on a same hard line coaxial cable 110. Diplex filters consist of a high-pass section 119 and a low-pass section 120. Splitter/ combiners 111 and 112 split the downstream signals and combine the upstream signals. Two-way amplifiers 113-118 boost the signal level in both directions to overcome the loss of the coaxial cable and splitter/combiners. Taps, such as a tap 230, are also splitting/combining devices that allow downstream signal extraction and upstream signal insertion. A coaxial cable plant 125 can be defined as the coaxial portion of the bi-directional cable system 100, which extends from the fiber node 104 to the insides of the houses such as a house 202.

Typically, the coaxial cable plant 125 is constructed of solid sheath hard-line aluminum coaxial cable from the fiber node 104 to the tap 230, and a braided shield drop cable 232 is used from the tap 230 to the house 202 as well as inside the house 202. All coaxial cable has a single center conductor, which is typically surrounded by a foam dielectric. Hard line coaxial cable has a single shield, and flexible drop coaxial cable normally has multiple shields that are electrically in contact with each other.

DESCRIPTION FIG. 2

Figure 2:
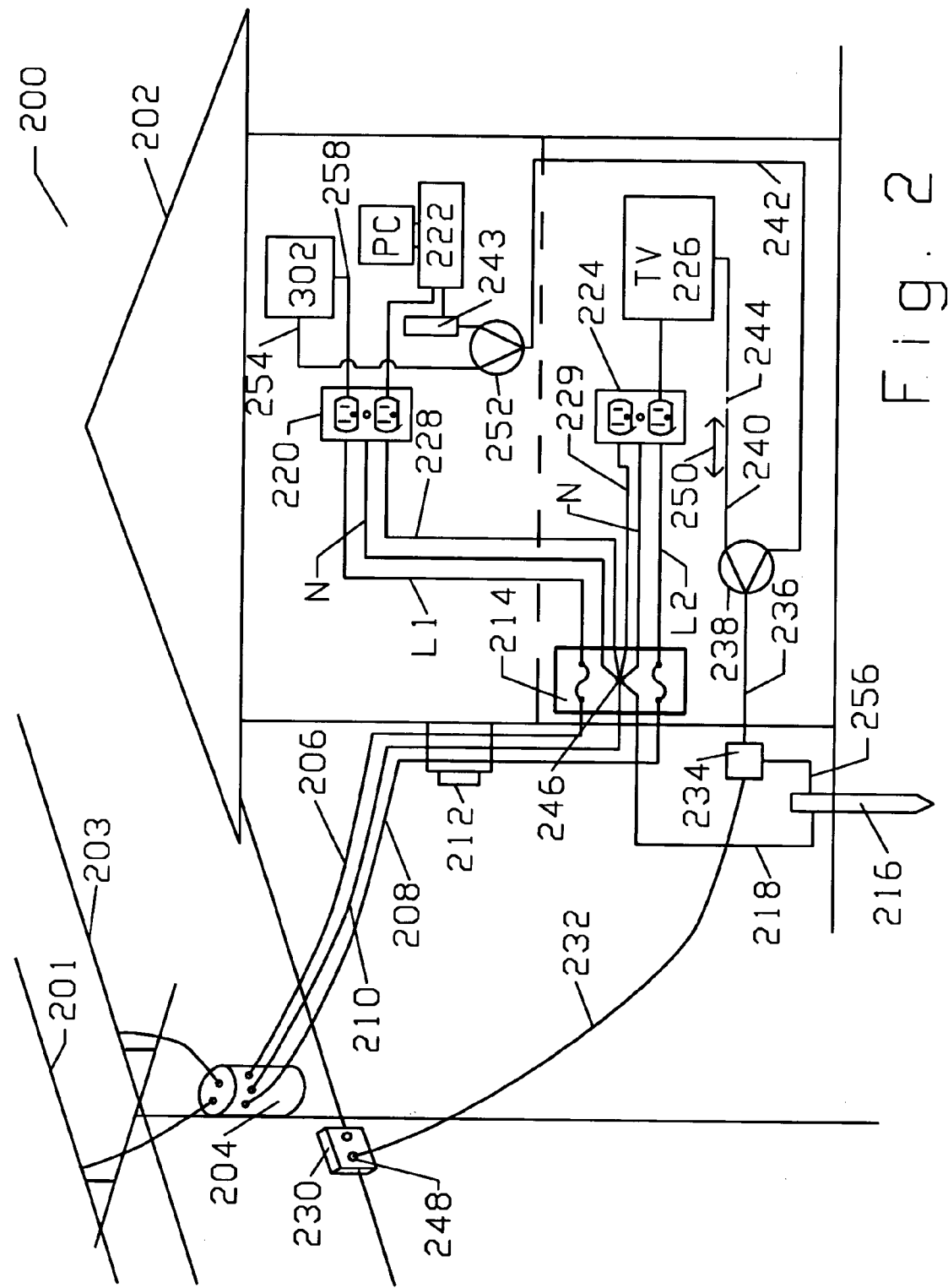
FIG. 2 is a block diagram of a building showing its AC power line system and its cable system.

FIG. 2 is a block diagram 200 of the house 202 showing both electrical power wiring and cable wiring. AC power is supplied to the house 202 through a high-voltage line 201 and a high-voltage line 203, a power transformer 204, a first secondary line (L1) 206, a second secondary line (L2) 208 and a neutral return (N) 210. Typically on the side of the house, the power lines L1, L2 and N, pass through a power meter 212 into a circuit breaker panel 214. The circuit breaker panel 214 is connected to a ground rod 216 through a power grounding wire 218. The first secondary line 206 is a first phase of the AC power and the second secondary line 208 is a second phase of the AC power. The first phase and the second phase both have an electric potential of 120 volts AC with respect to neutral return (N) 210, but 240 VAC with respect to each other. Relative to the neutral return (N) 210, if the first phase is at 0 degrees, the second phase will be at 180 degrees, essentially doubling the voltage. AC power passes through the circuit breaker panel 214 where circuit breakers, or fuses, protect circuits from a short circuit in the house. In this example, the first secondary line (L1) 206 and the neutral return (N) 210 are routed to an upstairs wall socket 220 where a personal computer (PC) 222 is connected. The second secondary line (L2) 208 and the neutral return (N) 210 are routed to a downstairs wall outlet 224 where a television (TV) 226 is plugged-in. In newer houses, both the wall outlets 220 and 224 will have third ground wires 228 and 229 respectively, which are connected to the neutral return (N) 210 in the circuit breaker panel 214. Thus, in the circuit breaker panel 214 at a common connection point 246, the neutral returns (N) 210 connect to the ground wires 228 and 229 and the power grounding wire 218.

Overlaid on the house AC power wiring diagram is the cable wiring. Downstream cable signals flow from a tap 230, through a drop cable 232, through a ground block 234 into a feeder coax 236. A cable ground wire 256 connects the ground block 234 to the ground rod 216. At a splitter 238 the cable signal is split to feed a coax cable 240 to a TV and a coax cable 242 to a cable modem 243. An optional signal insertion splitter 252 connects the cable modem 243 to the coax cable 242. An optional trigger signal coax cable 254 connects a test signal generator 302 to the signal insertion splitter 252.

As an example, assume that there is a coaxial shield break 244 in the coax cable 240 to the TV. The test signal generator 302 is attached to the house wiring at the upstairs wall socket 220 through an AC test plug 258, and a radio frequency (RF) test signal current flows through neutral return (N) and first secondary line. When the RF test signal current reaches the common connection point 246 it will flow to the power grounding wire 218, into the neutral return (N) 210 (which runs throughout the house) and to all wall outlets through ground wires, such as the ground wires 228 and 229. Some of the test signal current will flow from the ground rod 216 to the ground block 234, to the feeder coax 236, across the outside of the splitter 238 and the onto the coax cable 240 to the TV. When a portion of the test signal current reaches the shield break 244, it will be reflected, creating an electric field across the shield break 244. This electric field induces a current to flow in the center conductor of the coax cable 240 to the TV. An induced test signal 250 will propagate in the upstream direction back to the headend. The induced test signal 250 can be detected in several locations using a receiver. Possible reception locations include the ground block 234, in the drop cable 232, or at a drop-to-tap connection point 248. The reception of the induced test signal 250 can also be done at the headend.

Receivers to display the induced test signal 250 include spectrum analyzers, such as the Agilent model HP8591, cable specific noise detection instruments such as the Acterna model CLI-1450 or time domain signal acquisition devices, such as the Tektronix TDS-1002 digital oscilloscope. If a sampling time domain signal acquisition device is used to capture the induced test signal 250, the induced test signal 250 can be converted into the frequency domain via a fast Fourier transform to show spectral components. A useful characteristic of the receiver is an ability to measure the power of the induced test signal and display the measured power. This allows technicians to make a decision on whether the building passes specifications or needs to be repaired.

It may be useful to supply a high-pass filter between the receiver and the upstream test point to remove undesired low frequency noise, such as switching regulator noise and AC hum. A corner frequency, such as 1 MHz, may be used in the high-pass filter One concern that cable operators will have with using the test signal generator 302 is a possibility of disrupting or interfering with upstream cable signals if the two-way plant is active. There are a number of solutions to this problem. For example, the drop cable 232 can be disconnected from the tap 230 at the drop-to-tap connection point 248. Another solution is to use a filter inside the test signal generator 302 to remove (or notch-out) energy at sensitive frequencies, which are used for cable upstream transmissions.

A novel solution is to use a brief test signal and include a burst trigger generator in the test signal generator 302. The brief test signal is applied to the AC test plug 258 and the burst trigger signal is connected to the trigger signal coax cable 254. The burst trigger generator's function is to generate a burst trigger signal that will trigger a receiver in the headend to capture the brief test signal The use of the brief test signal minimizes interference with upstream traffic. This approach will be discussed in detail in FIG. 3.

DESCRIPTION FIG. 3

Figure 3:
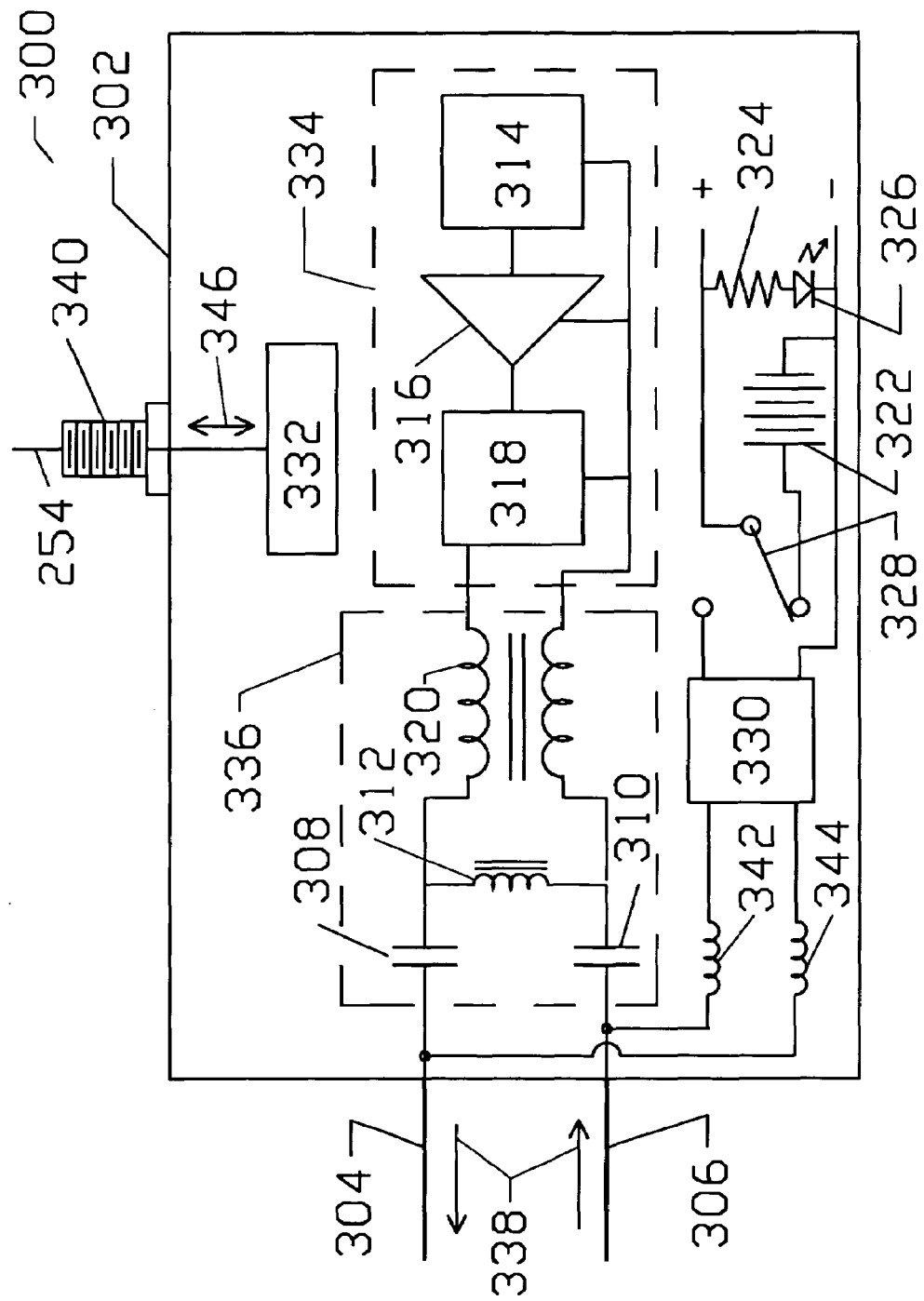
FIG. 3 is a block diagram of an insertion device to inject a test signal into an AC wall outlet.

FIG. 3 is a block diagram 300 of an example of the test signal transmitter 302 that can be used to generate a broadband test signal according to the present invention. The test signal generator 302 plugs into the wall socket 220 with two blades, a hot blade 304 connected to the first secondary line (L1) 206 and a neutral blade 306 connected to the neutral return (N) 210. The two blades comprise the AC test plug 258. A broadband signal generator 334 is comprised of a PN (pseudo-noise) generator 314, a power amplifier 316 and a low pass filter 318. The PN generator 314, which may be running at a chip rate of 50 MHz, connects to the power amplifier 316. The PN generator produces a broadband noise-like signal in a manner well known in the art. The output of the power amplifier connects to the low pass filter 318. The amplifier may be a class-A device, but since the PN test signal is a square wave, the amplifier may also be a high-efficiency class-C device. The low pass filter 318 limits undesired out-of-band energy, such as energy in the downstream band. A coupling device 336 connects the output of the broadband signal generator 334 to the AC test plug 258. A balun 320 converts a single-ended signal to a push-pull signal in a manner also well known in the art. A blocking capacitor 308, a blocking capacitor 310, and an inductor 312 keep AC power from damaging the low voltage components in the test signal generator. Another function of the coupling device 336 is to keep high voltage spikes on the AC power lines from damaging the amplifier 316. A test signal 338 is driven into the AC test plug 258 through the coupling device 336.

A battery 322 is the primary source of power for the test signal generator 302. An optional LED indicator light 326 shows the technician that the test signal generator 302 is transmitting. A resistor 324 limits current to the LED indicator light 236. An optional AC-to-DC converter 330, connected to the hot blade 304 and the neutral blade 306 through inductors 342 and 344, can be used to power the test signal generator 302 from the 120 VAC power applied to the blades. Inductors 342 and 344 prevent any test signal 338 from reaching the AC-to-DC converter 330. An optional power selector switch 328 supplies DC power from either the AC-to-DC converter or the battery. DC power (on the + and − leads) is regulated and applied to all active circuits.

An optional burst trigger generator 332 can be used to limit interference with upstream signals by providing a burst trigger signal 346, which is followed by a brief (short duration) test signal. The burst trigger generator 332 connects to a trigger F-connector 340, which connects to the trigger signal coax cable 254. A programmable logic device, such as are manufactured by Xilinx, Altera, or Cypress can be used to make the PN generator 314 as well as the burst trigger generator 332.

The burst trigger signal 346 may be a sine wave with a frequency that can pass through the upstream cable plant and the burst trigger signal 346 can be used to trigger a receiver in the headend 103. The duration of the burst trigger signal 346 can be very short, such as 5 microseconds. 25 MHz is one possible trigger burst frequency. Ideally, the burst trigger signal 346 will be in a vacant frequency band to prevent false triggering from data traffic. The receiver can be a time domain signal acquisition device such as a digital oscilloscope, or a spectrum analyzer such as an Agilent model HP8591 set into a single-shot mode. That is, once the spectrum analyzer in the headend is triggered (external trigger mode) by the trigger burst signal from the burst trigger generator 332, it performs a quick sweep (10 to 100 milliseconds) and then holds the spectrogram display until the next triggering event. In this mode, the broadband signal generator 334 transmits only while the spectrum analyzer is sweeping (10 to 100 milliseconds), thereby greatly reducing potential interference with upstream cable services.

The burst trigger signal 346 can be transmitted each time a technician presses a button (not illustrated) or automatically once every several seconds while the test signal generator 302 is powered. The burst trigger signal 346 can also be transmitted without the broadband signal generator 334 transmitting for the technician to view the background reference noise level.

If the capture device is a time domain signal acquisition device, the duration of the brief test signal can be exceedingly short, even less than 20 microseconds.

A broadband signal generator is defined as a controlled waveform that is generated by electronic means. Arcing electrical contacts do not make a broadband signal generator because they are not controlled. There are many types of potential test signals to use for the broadband signal generator 334. The test signals may be repeatable or non-repeatable. Examples of repeatable test signals are PN sequences, chirp signals, stepped-frequency chirp signals, Koo signals, OFDM (orthogonal frequency division multiplexing) reference signals, and band-limited impulses, such as a sine(x)/x signal. Random noise may be used as non-repeatable test signal. A good test signal has the properties of a flat frequency spectrum without spectral holes, and a low crest factor (low ratio of peak to average voltage).

The test signal generator 302 can be used to generate a continuous test signal for tests where the drop 232 is disconnected from the tap 230 and the receiver is located at the test site. Alternately, the test signal generator 302 can generate a brief test signal for tests where the receiver is located in the headend and the drop 232 is not disconnected from the tap 230.

DESCRIPTION FIG. 4

Figure 4:
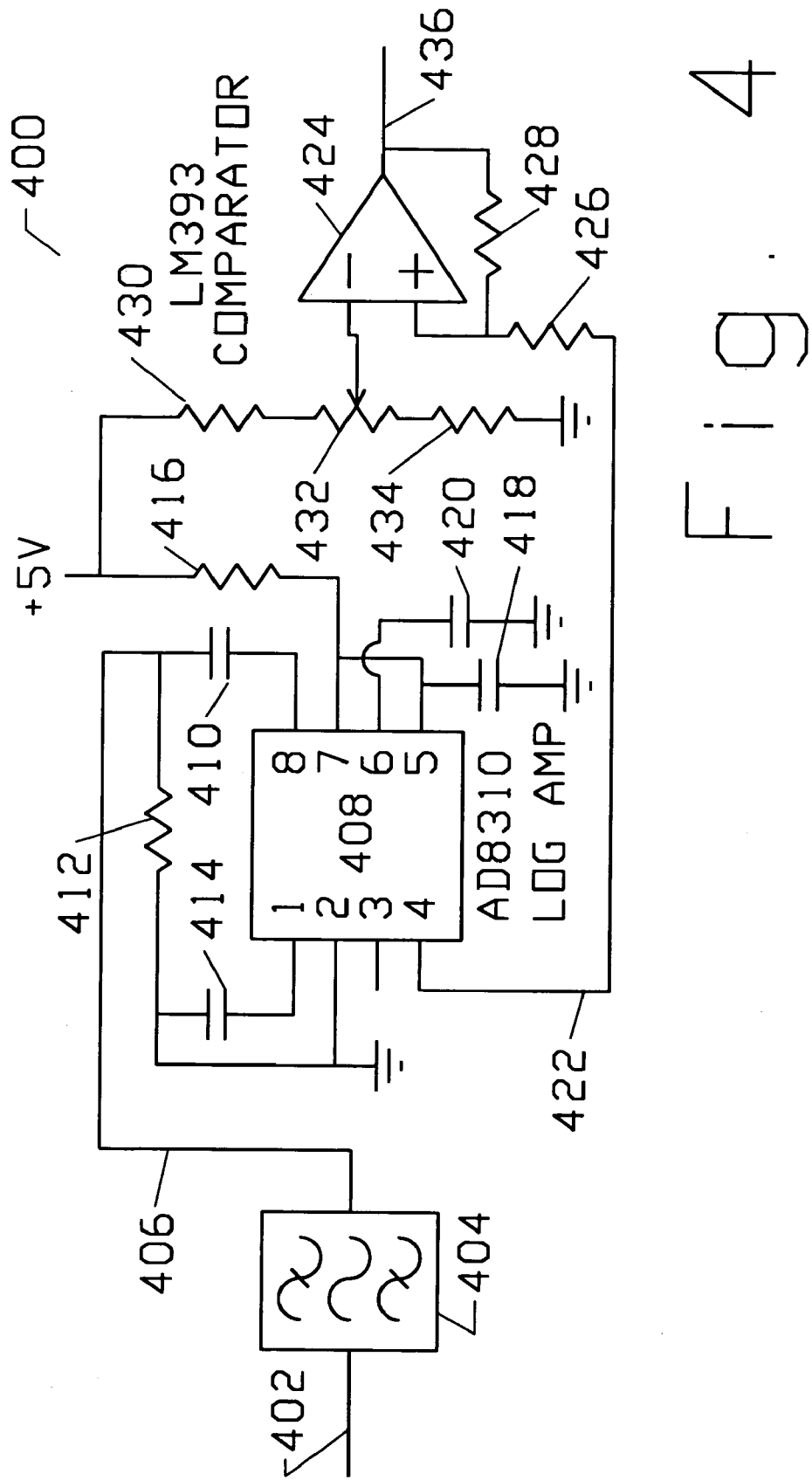
FIG. 4 is a schematic diagram of a trigger circuit that can provide a trigger pulse when a burst trigger signal is received

FIG. 4 is a schematic diagram of a trigger circuit 400 that provides a trigger pulse when a trigger burst signal is received. This device may be located in the headend and is used to trigger a receiver that displays the received induced test signal 250. An input line 402 is connected in the headend to an upstream fiber optic receiver, which is not illustrated. The input line 402 connects to a bandpass filter 404 that is tuned to the trigger burst signal frequency. This filter should have a narrow pass-band, such as one megahertz or less, so that it will reject undesired noise and signals such as data traffic while passing the trigger burst signal A bandpass filter's output 406 is connected to a terminating resistor 412 and a first coupling capacitor 410. The first coupling capacitor 410 connects to an input lead of a log amplifier integrated circuit 408, such as the Analog Devices AD8310. A second coupling capacitor 414 connects the other input of the log amplifier to ground. A resistor 416, along with a bypass capacitor 418, provide filtered DC power to the log amp.

The log amplifier converts an AC signal to a DC voltage level, which is proportional to the logarithm of the AC signal voltage. A capacitor 420 is selected to provide smoothing of the output DC voltage. Output lead 422, which carries a DC voltage indicative of AC signal level, is applied to a high-speed comparator IC 424 through a resistor 426. The high-speed comparator IC may be a National Semiconductor LM393. Resistors 430, 432 and 434 provide an adjustable voltage divider for the comparator. The adjustable voltage divider is set to provide reliable triggering without false-triggering. A resistor 428 provides for a hysteresis voltage so that a trigger line 436 will rise and fall sharply. The trigger line 436 is connected to an external trigger input of an instrument, such as a spectrum analyzer or a time domain signal acquisition unit. The instrument will record the brief induced test signal 250 when it is triggered. When a burst trigger signal 346 is received on input line 402 the trigger line 436 will go to a high voltage state for the duration of the trigger burst signal.

At the headend, the burst trigger signal 346 precedes the brief test signal and is used to trigger the receiver device. An image of the screen of the capture device can be relayed back to the technician in the field over a vacant TV channel by pointing a video camera at the display of the receiver, which may be a spectrum analyzer. The video output of the camera is connected into a modulator. The RF output of the modulator is inserted on the downstream cable system and delivered to the technician in the field over a vacant TV channel. This method is well known in the art. Another method is to relay the information from the headend to the technician in the field via the Internet over a cable modem or wireless phone with data. If a PC (personal computer) is controlling the receiver in the headend, a software application such as PC Anywhere® can be used to control the PC remotely.

SUMMARY, RAMIFICATIONS, AND SCOPE

Although the description above contains many specificities, these should not be construed as limiting the scope of the invention but as merely providing illustrations of some of the presently preferred embodiments of this invention. For example:
1. The test signal generator can use any type of test signal, such as a continuous sweep signal (chirp), a discrete-step sweep signal, such as is generated by a Holtzman Inc. model HE2M reference signal transmitter, a Koo signal (invented by David Koo and assigned to Philips Corp.), random noise, a train of impulses, or even a continuous wave signal (CW). The test signal may be brief or continuous.
2. Instead of injecting test current just into the hot and the neutral blades, test current can also be injected into the ground connection.
3. It is not mandatory that there be an electrical connection between the power lines and the coaxial cable shields to have an induced test signal. Experiments have shown that due to proximity, the test signal can be coupled radiation or magnetically coupled from the power lines to the shield of the coaxial wiring.
4. The capture device in the headend can perform averaging to limit the effects of additive noise on the received test signal.
5. Experience has shown that this technique is extremely sensitive and that even an undamaged low quality coaxial cable with poor shielding effectiveness can be detected.
6. Experience has also shown that many detected shield breaks will have varying levels of shielding effectiveness. Thus, it is useful to have a numerical result of received power to determine if a house is over a threshold.
7. The test signal generator 302 can be plugged into any wall outlet in the house, basement, or garage including outdoor outlets.
8. The burst trigger signal 346 may alternately occur after the test signal if a time domain signal acquisition device is employed.
9. It is possible to measure the amount of time required for the test signal to travel to the tap. This test could be done using an impulse test signal and an oscilloscope. However the resulting time-delay information may not provide useful clues as to the location of the shield break because the test current travels on both the house wiring and the coaxial cable.
10. The global positioning system (GPS) can be used to identify homes that have coaxial cable with poor shielding. Transmitting the GPS information into the trigger signal coaxial cable 254, followed by the transmission of a brief test signal 342 into the AC test plug 258, can do this. At the headend the GPS data and received signal is logged if the induced test signal is above a threshold value. Later the data are reviewed to generate repair service orders.
11. The brief test signal capture technique discussed in this patent application can be adapted to diagnose why transmissions from terminal devices, such as cable modems, cannot be received in the headend. A trigger signal can be generated when a terminal device transmits. The terminal device and the trigger signal transmit in different frequency bands, so interference is avoided. In the headend a receiver is triggered by the trigger signal and captures the transmission from the terminal device for analysis. The analysis may show excessive linear distortion, hum modulation, carrier cross-compression or other transmission problems.
12. Experience has shown that test signal energy in the 5-15 MHz portion of the 5-42 MHz upstream frequency band is less attenuated than energy in the higher portion of the upstream band.

What I claim is:

1. A test system for finding a break in a shield of a coaxial cable, the test system comprising:
    a broadband signal generator having a controllable output that supplies a test signal;
    a coupling device for coupling the test signal to AC power lines in a building;
    an electrical coupling between the AC power lines and a coaxial cable in the building;
    a receiver connected to a center conductor of the coaxial cable, for receiving an induced test signal from a shield to the center conductor, and for indicating when the magnitude of the induced test signal received exceeds the magnitude of the induced test signal received from an unbroken coaxial cable, thereby indicating a shield break is present in the coaxial cable.

2. A test system according to claim 1 wherein the induced test signal is received at a headend.

3. A test system according to claim 1 wherein the induced signal is received at the building.

4. A test system according to claim 1 wherein the test signal has energy at a plurality of frequencies.

5. A test system according to claim 1 wherein the test signal is a PN sequence.

6. A test system for finding a break in a shield of a coaxial cable, the test system comprising:
    a broadband signal generator having an output that supplies a brief test signal;
    a burst trigger generator that produces a burst trigger signal;
    a connection for connecting the burst trigger signal to the cable wiring in a building;
    a coupling device for coupling the brief test signal to AC power lines in the building;
    an electrical coupling between the AC power lines and a coaxial cable in the building;
    a trigger circuit connected to the coaxial cable and a receiver and the receiver connected to a center conductor of the coaxial cable, for receiving an induced brief test signal from a shield to the center conductor when triggered by the trigger circuit, and for indicating when the magnitude of the induced brief test signal received exceeds the magnitude of the induced brief test signal received from an unbroken coaxial cable, thereby indicating a shield break is present in the coaxial cable.

7. A test system according to claim 6 wherein the receiver is a spectrum analyzer.

8. A test system according to claim 6 wherein the receiver is a time domain signal acquisition device.

* * * * *